(12) United States Patent
Fukuda

(10) Patent No.: US 8,542,070 B2
(45) Date of Patent: Sep. 24, 2013

(54) PIEZOELECTRIC VIBRATOR, OSCILLATOR, ELECTRONIC APPARATUS, AND RADIO-CONTROLLED TIMEPIECE

(75) Inventor: Junya Fukuda, Chiba (JP)

(73) Assignee: Seiko Instruments Inc., Chiba (JP)

( * ) Notice: Subject to any disclaimer, the term of this patent is extended or adjusted under 35 U.S.C. 154(b) by 41 days.

(21) Appl. No.: 13/018,837

(22) Filed: Feb. 1, 2011

(65) Prior Publication Data

US 2011/0187471 A1     Aug. 4, 2011

(30) Foreign Application Priority Data

Feb. 3, 2010   (JP) ................. 2010-022407

(51) Int. Cl.
| | |
|---|---|
| *H03B 5/32* | (2006.01) |
| *H01L 41/047* | (2006.01) |
| *H01L 41/053* | (2006.01) |
| *H01L 41/22* | (2006.01) |

(52) U.S. Cl.
USPC ............ 331/68; 331/158; 29/25.35; 310/344; 310/348; 310/366; 310/370

(58) Field of Classification Search
USPC ................ 29/25.35; 310/311, 344, 348, 349, 310/365, 366, 370; 331/68, 108 C, 108 D, 331/116 FE, 116 M, 116 R, 154, 158
See application file for complete search history.

(56) References Cited

U.S. PATENT DOCUMENTS

| | | | | |
|---|---|---|---|---|
| 7,176,604 | B2 * | 2/2007 | Nakatani ....................... | 310/370 |
| 7,253,554 | B2 * | 8/2007 | Dalla Piazza et al. ........ | 310/370 |
| 7,521,846 | B2 * | 4/2009 | Tanaya .......................... | 310/370 |
| 7,550,905 | B2 * | 6/2009 | Tanaya .......................... | 310/370 |
| 7,872,404 | B2 * | 1/2011 | Numata et al. ................ | 310/370 |
| 2007/0007864 | A1 * | 1/2007 | Tanaya .......................... | 310/367 |
| 2009/0015106 | A1 * | 1/2009 | Tanaya .......................... | 310/344 |
| 2009/0256449 | A1 * | 10/2009 | Nishimura et al. ........... | 310/348 |

FOREIGN PATENT DOCUMENTS

JP   2007-096899 A   4/2007

* cited by examiner

*Primary Examiner* — Levi Gannon

(74) *Attorney, Agent, or Firm* — Brinks Hofer Gilson & Lione

(57) ABSTRACT

There are provided a piezoelectric vibrator capable of suppressing vibration leakage while securing mounting strength of a piezoelectric vibrating reed and an oscillator, an electronic apparatus, and a radio-controlled timepiece each using the piezoelectric vibrator. The piezoelectric vibrator includes: a package that accommodates a piezoelectric vibrating reed; and a bump that mounts the base portion of the piezoelectric vibrating reed on a package. The bump includes a plurality of main bumps which is arranged in a line in the width direction of the base portion so as to be bonded to the base portion; and an auxiliary bump which is bonded to the base portion in an area between the main bumps disposed at both ends in the width direction of the base portion and an area between the main bumps and base ends of the vibrating arms in the longitudinal direction of the base portion.

20 Claims, 12 Drawing Sheets

PIEZOELECTRIC VIBRATOR, OSCILLATOR, ELECTRONIC APPARATUS, AND RADIO-CONTROLLED TIMEPIECE

RELATED APPLICATIONS

This application claims priority under 35 U.S.C. §119 to Japanese Patent Application No. 2010-022407 filed on Feb. 3, 2010, the entire content of which is hereby incorporated by reference.

BACKGROUND OF THE INVENTION

1. Field of the Invention

The present invention relates to a piezoelectric vibrator, an oscillator, an electronic apparatus, and a radio-controlled timepiece.

2. Description of the Related Art

In recent years, piezoelectric vibrators using crystal or the like have been used in mobile phones or portable information terminals as a time source, a control signal timing source, a reference signal source, and the like. Various piezoelectric vibrators are available as such kinds of piezoelectric vibrators, and a piezoelectric vibrator in which a so-called tuning fork-type piezoelectric vibrating reed is sealed in a package is also known as one of the piezoelectric vibrators.

A tuning-fork-type piezoelectric vibrating reed is a thin plate-like crystal reed which includes a pair of vibrating arms arranged in a line in a width direction thereof and a base portion that integrally fixes base end sides in the longitudinal direction of the pair of vibrating arms. A pair of excitation electrodes is formed on both the upper and lower surfaces of each of the vibrating arms of the piezoelectric vibrating reed with a predetermined gap therebetween. Moreover, a pair of mount electrodes is formed on both the upper and lower surfaces of the base portion and electrically connected to a pair of excitation electrodes through a pair of extraction electrodes. On the other hand, bumps made of gold or the like are formed on the inner electrodes of the package.

The mount electrodes of the piezoelectric vibrating reed are mounted on the inner electrodes of the package, whereby a piezoelectric vibrator is formed. Specifically, the piezoelectric vibrating reed is mounted in the package by a so-called flip-chip bonding method in which the mount electrodes of the piezoelectric vibrating reed are pressed against the bumps on the inner electrodes to cause ultrasonic vibration, whereby the mount electrodes and the bumps are ultrasonically bonded to each other.

However, when the piezoelectric vibrating reed is mounted in the package by the flip-chip bonding method, the mounting strength of the piezoelectric vibrating reed decreases if the number of bumps being bonded is small. Moreover, when an impact load is applied to the piezoelectric vibrator, there is a problem in that the piezoelectric vibrating reed falls off the mounting surface of the package, and accordingly, an oscillation stops. In order to obviate such a problem, a method of increasing the number of bumps to improve the mounting strength of the piezoelectric vibrating reed may be considered.

JP-A-2007-096899 discloses a piezoelectric vibrating reed in which two bumps are formed on each of a pair of connection electrodes (corresponding to the lead-out electrodes of the present invention) in the package along the longitudinal direction of the piezoelectric vibrating reed, and the respective bumps are bonded to pad electrodes (corresponding to the mount electrodes of the present invention). In the piezoelectric vibrating reed disclosed in JP-A-2007-096899, since the piezoelectric vibrating reed is mounted on the package using four bumps in total, even when an impact load is applied to the piezoelectric vibrator, stress resulting from the impact load applied to the bonding portion of the piezoelectric vibrating reed can be distributed to a plurality of bumps. Therefore, the mounting strength of the piezoelectric vibrating reed can be improved.

However, since the piezoelectric vibrating reed disclosed in JP-A-2007-096899 is firmly mounted on the package by means of a plurality of bumps, there is a possibility that, when the piezoelectric vibrating reed is operated, so-called vibration leakage may occur. That is, vibration energy of the piezoelectric vibrating reed may leak to the outside through the plurality of bumps. When vibration energy of the piezoelectric vibrating reed leaks to the outside when vibration leakage occurs, there is a possibility that the energy efficiency of the piezoelectric vibrator will decrease. Moreover, when the piezoelectric vibrator with vibration leakage is mounted on a substrate of an electronic apparatus or the like, since the degree of binding of the piezoelectric vibrator is different in accordance with solid variations in the mounting state such as the amount of solder, there is a problem in that the vibration properties of the piezoelectric vibrator fluctuate.

SUMMARY OF THE INVENTION

The invention has been made in view of the above problems. An object of the present invention is to provide a piezoelectric vibrator capable of suppressing vibration leakage while securing a mounting strength of a piezoelectric vibrating reed and an oscillator, an electronic apparatus, and a radio-controlled timepiece each using the piezoelectric vibrator.

In order to solve the problems, according to an aspect of the present invention, there is provided a piezoelectric vibrator including: a piezoelectric vibrating reed including a pair of vibrating arms arranged in a line along a width direction thereof, and a base portion that integrally fixes base end sides in a longitudinal direction of the pair of vibrating arms; a package that accommodates the piezoelectric vibrating reed; and a bump that mounts the base portion of the piezoelectric vibrating reed on the package, wherein the bump includes: a plurality of main bumps which is arranged in a line in the width direction of the base portion so as to be bonded to the base portion; and an auxiliary bump which is bonded to the base portion in an area between the main bumps disposed at both ends in the width direction of the base portion and an area between the main bumps and base ends of the vibrating arms in the longitudinal direction of the base portion.

According to this configuration, since the base portion of the piezoelectric vibrating reed is bonded to the package by the plurality of main bumps and the auxiliary bump, it is possible to improve the mounting strength of the piezoelectric vibrating reed. Moreover, the auxiliary bump is bonded to the base portion in an area between the main bumps disposed at both ends in the width direction of the base portion and an area between the main bumps and base ends of the vibrating arms in the longitudinal direction of the base portion. These areas are near the nodal point of vibration as disclosed in the Journal of IEICE (The Institute of Electronics, Information and Communication Engineers), Volume J72-A, No. 11, Page 1736, November 1989. Therefore, the magnitude of vibration of the piezoelectric vibrating reed is small in these areas. Since the auxiliary bump is bonded to the base portion in the areas near the nodal point of vibration where the magnitude of vibration is small, the vibration of the piezoelectric vibrating reed will rarely leak to the outside through the auxiliary bump. In this way, it is possible to suppress the vibration leakage of the piezoelectric vibrator. Therefore, it is possible to suppress the vibration leakage of the piezoelectric vibrator while securing the mounting strength of the piezoelectric vibrating reed.

The auxiliary bump is preferably disposed approximately at the center in the width direction of the base portion.

According to this configuration, since the auxiliary bump is disposed approximately at the center in the width direction of the base portion, the auxiliary bump is disposed at a position closer to the nodal point of vibration. Therefore, it is possible to further suppress the vibration leakage of the piezoelectric vibrator while securing the mounting strength of the piezoelectric vibrating reed.

The auxiliary bump is preferably disposed at a position which is separated from a tip end of the base portion toward the base end side by a distance corresponding to approximately a half of the width of the vibrating arm.

As disclosed in the Journal of IEICE (The Institute of Electronics, Information and Communication Engineers), Volume J72-A, No. 11, Page 1736, November 1989, the position which is separated from the tip end of the base portion toward the base end side by a distance corresponding to approximately a half of the width of the vibrating arm corresponds to the nodal point of the vibration of the piezoelectric vibrating reed. With this configuration, since the auxiliary bump is disposed at the nodal point of vibration, the vibration of the piezoelectric vibrating reed will rarely leak to the outside through the auxiliary bump. Therefore, it is possible to further suppress the vibration leakage of the piezoelectric vibrator while securing the mounting strength of the piezoelectric vibrating reed.

A recess portion is preferably formed on a side surface in the width direction of the base portion, and the recess portion is preferably disposed between the main bumps and the auxiliary bump in the longitudinal direction.

With this configuration, since the recess portion is formed on the side surface in the width direction of the base portion, the vibration of the vibrating arm is more rarely transmitted to the base end side than the recess portion. Moreover, since the recess portion is disposed between the main bumps and the auxiliary bump in the longitudinal direction, the vibration of the piezoelectric vibrating reed will rarely be transmitted to the main bump. As a result, the vibration of the piezoelectric vibrating reed will rarely leak to the outside through the main bumps. Therefore, it is possible to further suppress the vibration leakage of the piezoelectric vibrator while securing the mounting strength of the piezoelectric vibrating reed.

According to another aspect of the invention, there is provided an oscillator in which the above-described piezoelectric vibrator is electrically connected to an integrated circuit as an oscillating piece.

According to still another aspect of the invention, there is provided an electronic apparatus in which the above-described piezoelectric vibrator is electrically connected to a clock section.

According to still another aspect of the invention, there is provided a radio-controlled timepiece in which the above-described piezoelectric vibrator is electrically connected to a filter section.

Since each of the oscillator, electronic apparatus, and radio-controlled timepiece of the above aspects of the present invention includes the piezoelectric vibrator capable of suppressing the vibration leakage while securing the mounting strength of the piezoelectric vibrating reed, an oscillator, an electronic apparatus, and a radio-controlled timepiece having superior reliability and excellent performance can be provided.

According to this configuration, since the base portion of the piezoelectric vibrating reed is bonded to the package by the plurality of main bumps and the auxiliary bump, it is possible to improve the mounting strength of the piezoelectric vibrating reed. Moreover, the auxiliary bump is bonded to the base portion in an area between the main bumps disposed at both ends in the width direction of the base portion and an area between the main bumps and base ends of the vibrating arms in the longitudinal direction of the base portion. These areas are near the nodal point of vibration as disclosed in the Journal of IEICE (The Institute of Electronics, Information and Communication Engineers), Volume J72-A, No. 11, Page 1736, November 1989. Therefore, the magnitude of vibration of the piezoelectric vibrating reed is small in these areas. Since the auxiliary bump is bonded to the base portion in the areas near the nodal point of vibration where the magnitude of vibration is small, the vibration of the piezoelectric vibrating reed will rarely leak to the outside through the auxiliary bump. In this way, it is possible to suppress the vibration leakage of the piezoelectric vibrator. Therefore, it is possible to suppress the vibration leakage of the piezoelectric vibrator while securing the mounting strength of the piezoelectric vibrating reed.

DESCRIPTION OF PREFERRED EMBODIMENT

Hereinafter, a piezoelectric vibrator and a piezoelectric vibrating reed according to an embodiment of the present invention will be described with reference to the accompanying drawings.

Moreover, in the following description, it is assumed that the mounting surface of a base substrate bonded to a lid substrate is an upper surface U and the opposite surface is a lower surface L.

Moreover, it is assumed that the longitudinal direction of the piezoelectric vibrator is a longitudinal direction X, a base end side of the vibrating arm is a positive X direction, and a tip end side of the vibrating arm is a negative X direction. Moreover, it is assumed that the width direction of the piezoelectric vibrating reed is a width direction W.

Figure 1:
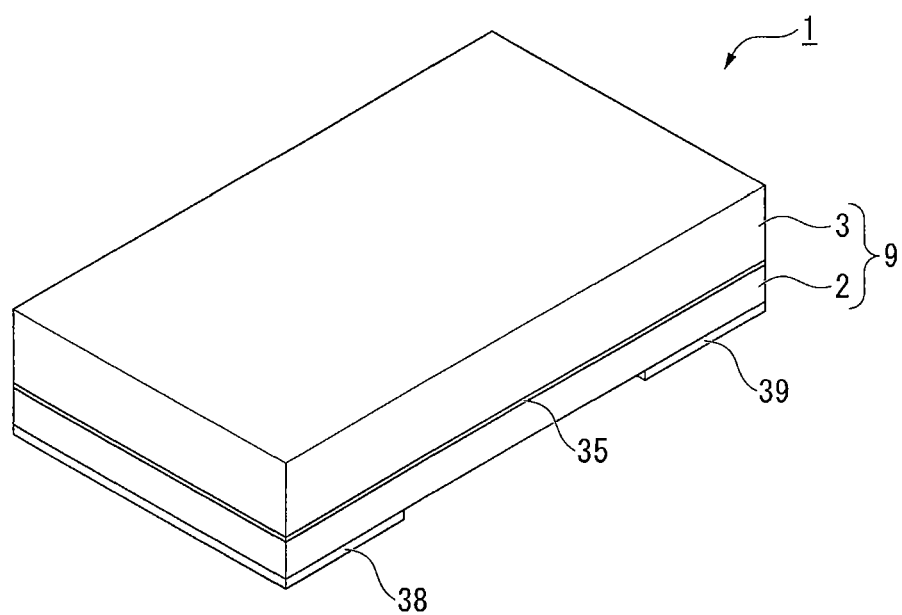
FIG. 1 is a perspective view showing an external appearance of a piezoelectric vibrator according to an embodiment of the present invention.

FIG. 1 is a perspective view showing an external appearance of a piezoelectric vibrator according to an embodiment of the present invention.

Figure 2:
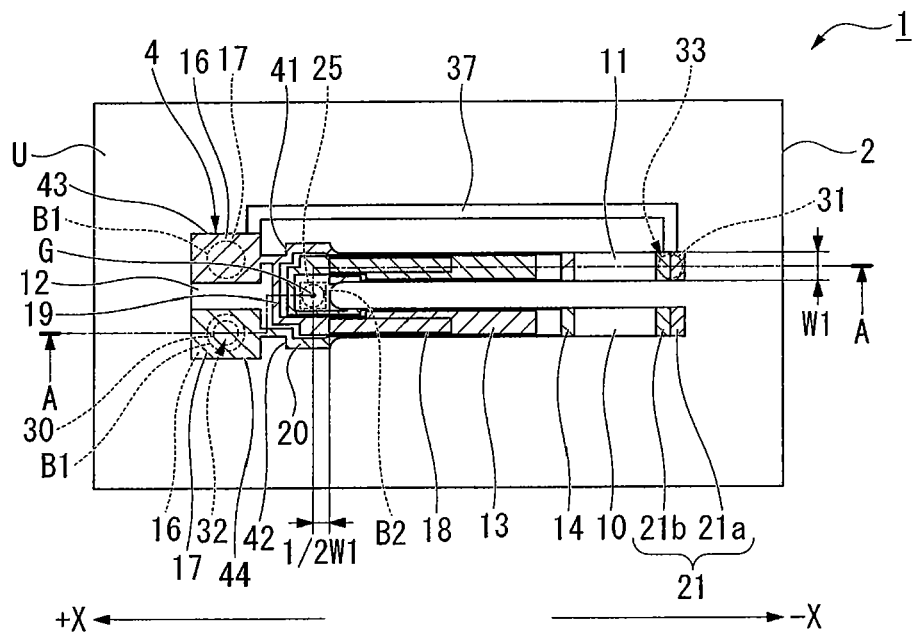
FIG. 2 is a top view showing an inner structure of the piezoelectric vibrator shown in FIG. 1, showing a state where a lid substrate is removed.

FIG. 2 is a top view showing an inner structure of the piezoelectric vibrator, showing a state where a lid substrate is removed.

Figure 3:
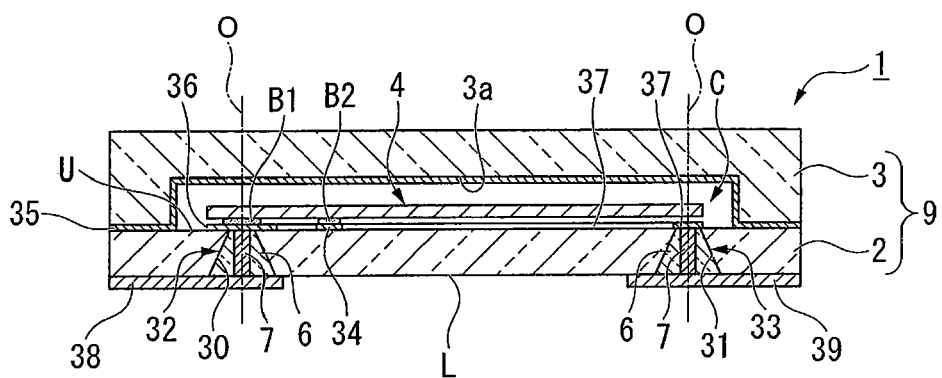
FIG. 3 is a sectional view of the piezoelectric vibrator taken along the line A-A in FIG. 2.

FIG. 3 is a sectional view of the piezoelectric vibrator taken along the line A-A in FIG. 2.

Figure 4:
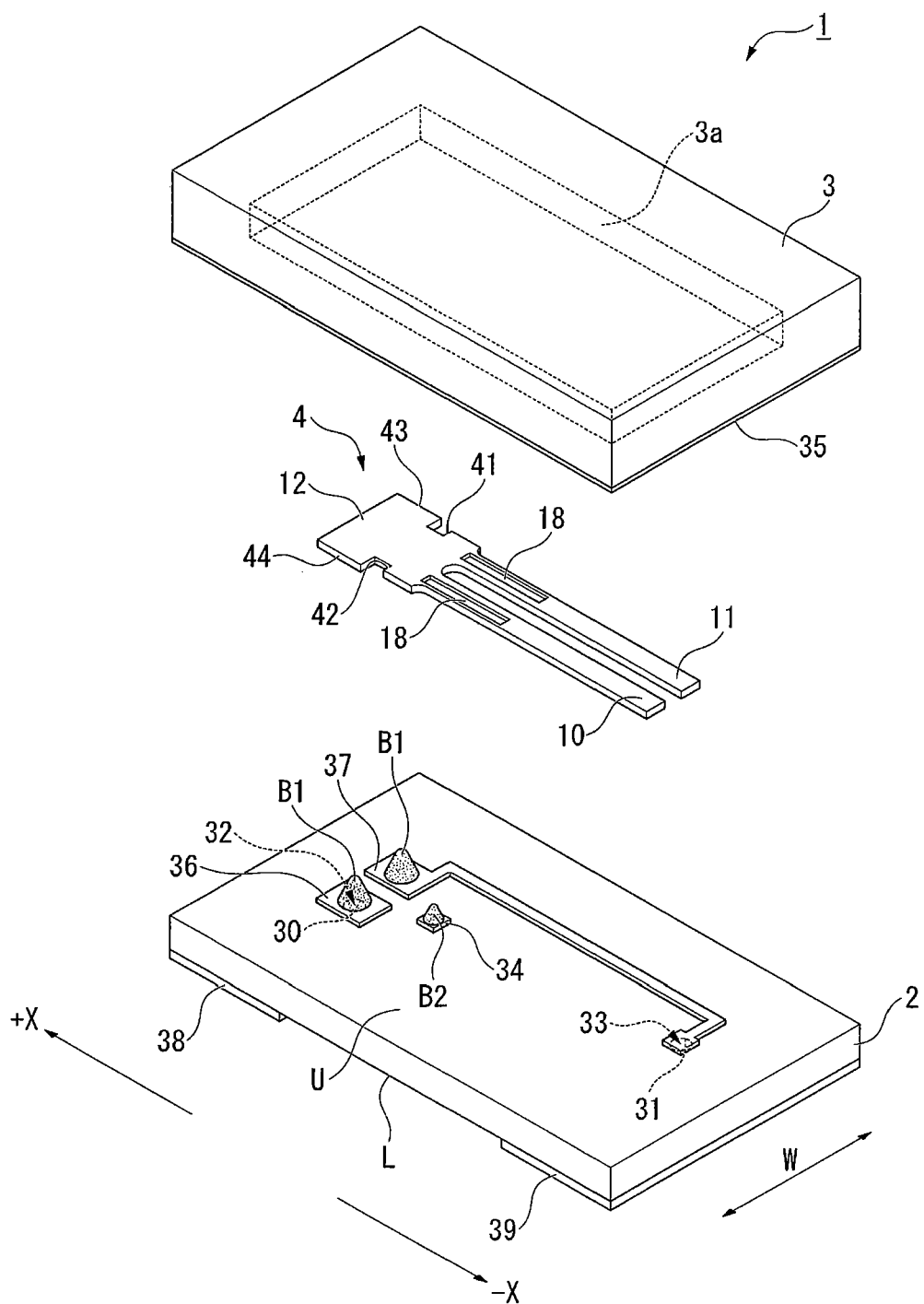
FIG. 4 is an exploded perspective view of the piezoelectric vibrator shown in FIG. 1.

FIG. 4 is an exploded perspective view of the piezoelectric vibrator shown in FIG. 1. In FIG. 4, for better understanding of the drawings, illustrations of the excitation electrode 15, extraction electrodes 19 and 20, main mount electrodes 16 and 17, auxiliary mount electrode 25, and weight metal film 21 are omitted.

As shown in FIGS. 1 to 4, a piezoelectric vibrator 1 according to the present embodiment is a surface mount device-type piezoelectric vibrator 1 which includes a package 9, in which a base substrate 2 and a lid substrate 3 are anodically bonded to each other with a bonding film 35 disposed therebetween, and a piezoelectric vibrating reed 4 which is accommodated in a cavity C of the package 9.

Piezoelectric Vibrating Reed

Figure 5:
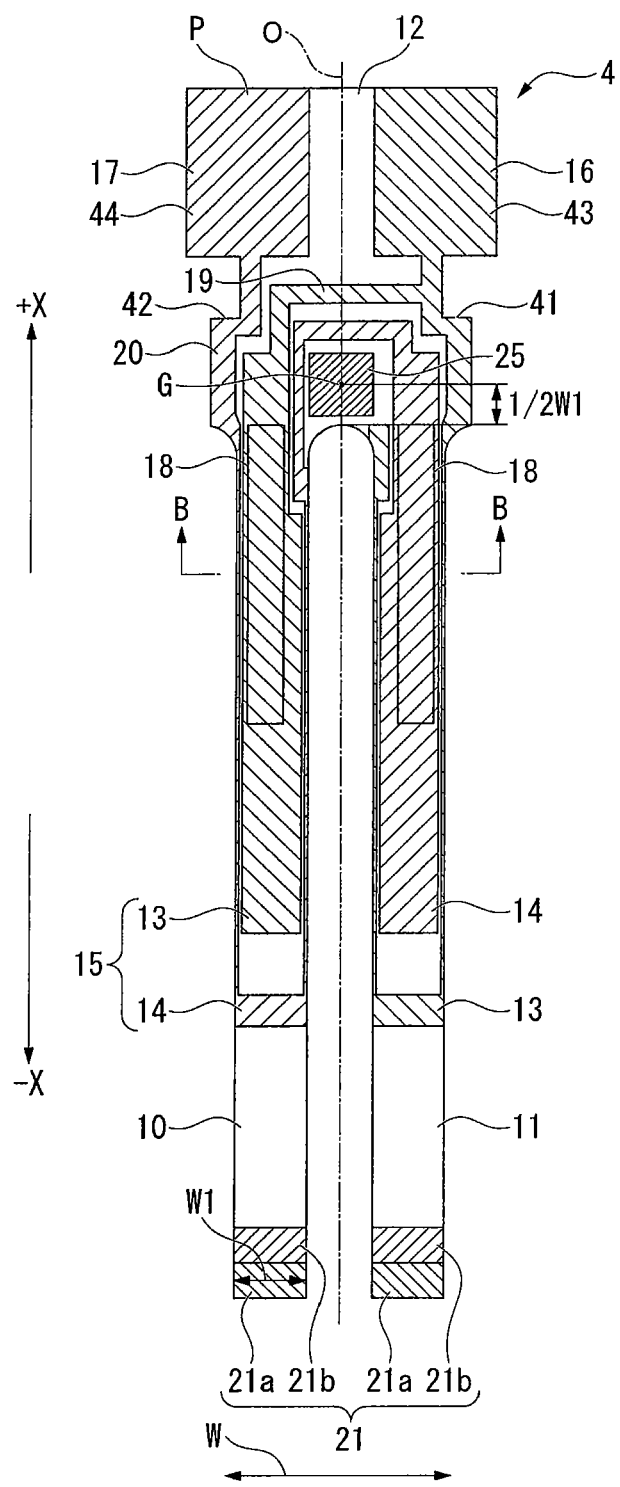
FIG. 5 is a top view of a piezoelectric vibrating reed.

FIG. 5 is a top view of a piezoelectric vibrating reed.

Figure 6:
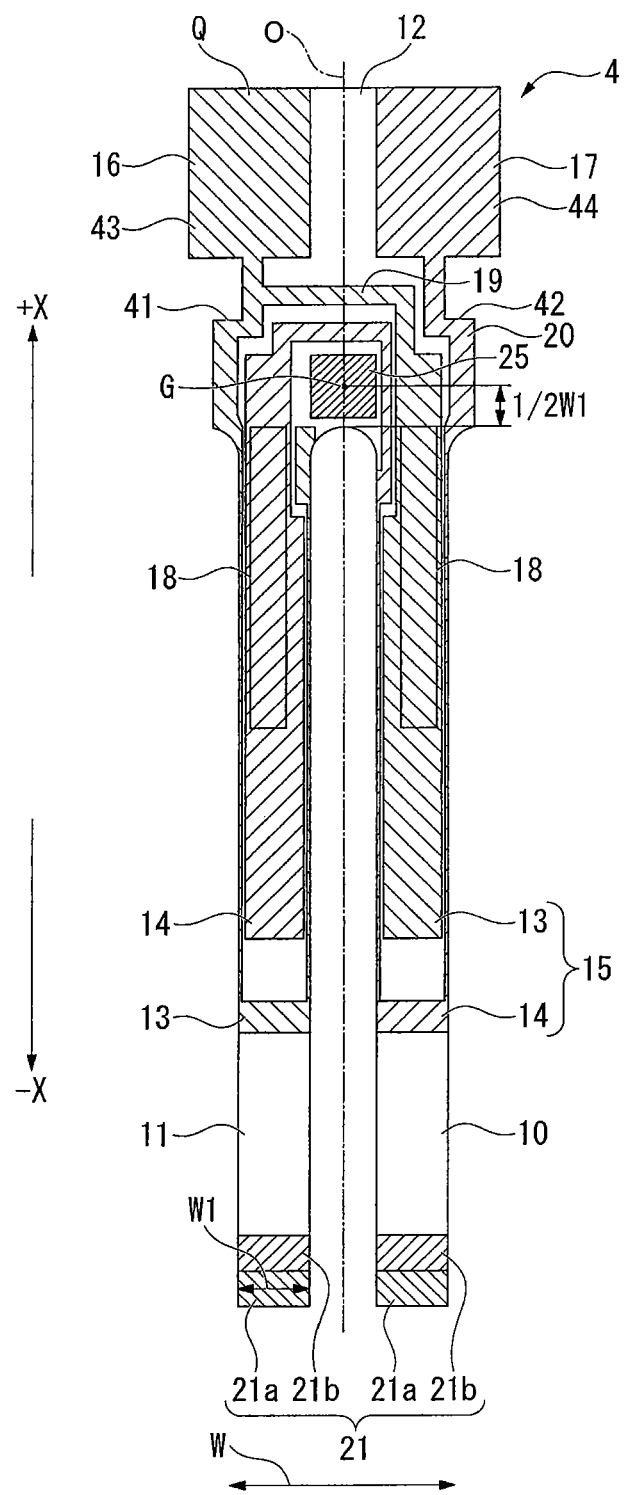
FIG. 6 is a bottom view of the piezoelectric vibrating reed.

FIG. 6 is a bottom view of the piezoelectric vibrating reed.

Figure 7:
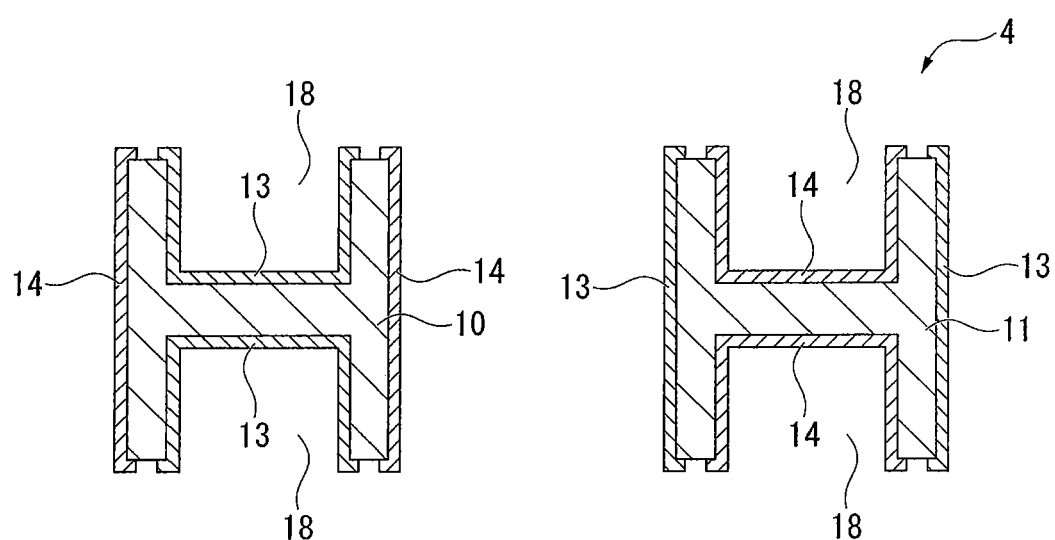
FIG. 7 is a sectional view taken along the line B-B in FIG. 5.

FIG. 7 is a sectional view taken along the line B-B in FIG. 5.

In FIGS. 5 to 7, it is assumed that the mounting surface of the piezoelectric vibrating reed 4 is a lower surface Q and the opposite surface is an upper surface P.

Hereinafter, the piezoelectric vibrating reed 4 will be described with reference to the drawings.

As shown in FIGS. 5 to 7, the piezoelectric vibrating reed 4 is a turning-fork type vibrating reed which is made of a piezoelectric material such as crystal, lithium tantalate, or lithium niobate and is configured to vibrate when a predetermined voltage is applied thereto.

As shown in FIGS. 5 and 6, the piezoelectric vibrating reed 4 according to the present embodiment includes a pair of vibrating arms 10 and 11 arranged in a line in the width direction W and a base portion 12 that integrally fixes the base end sides in the longitudinal direction X of the pair of vibrating arms 10 and 11. The piezoelectric vibrating reed 4 further includes an excitation electrode 15 which is formed on the outer surfaces of the pair of vibrating arms 10 and 11 so as to vibrate the pair of vibrating arms 10 and 11 and which includes a first excitation electrode 13 and a second excitation electrode 14.

On both the upper surface P and the lower surface Q of each of the pair of vibrating arms 10 and 11, a pair of vertically long groove portions 18 is formed to have a fixed width along the longitudinal direction X. The groove portions 18 are formed in a range exceeding intermediate portions from the base end sides of the vibrating arms 10 and 11. As a result, each of the pair of vibrating arms 10 and 11 has an H-shaped section when seen along the line B-B as shown in FIG. 7.

As shown in FIGS. 5 and 6, the pair of excitation electrodes 13 and 14 is formed on both the upper surface P and the lower surface Q of each of the pair of vibrating arms 10 and 11. The pair of excitation electrodes 13 and 14 is an electrode that allows the pair of vibrating arms 10 and 11 to vibrate at a predetermined resonance frequency in a direction of moving closer to or away from each other when a voltage is applied thereto. The pair of excitation electrodes 13 and 14 is patterned on the surfaces of the pair of vibrating arms 10 and 11 in an electrically isolated state. Specifically, as shown in FIG. 7, one excitation electrode 13 is mainly formed in the groove portion 18 of one vibrating arm 10 and on the side surfaces of the other vibrating arm 11. On the other hand, the other excitation electrode 14 is mainly formed on the side surfaces of one vibrating arm 10 and in the groove portion 18 of the other vibrating arm 11.

In addition, as shown in FIGS. 5 and 6, a weight metal film 21 configured to include a rough tuning film 21a and a fine tuning film 21b for adjusting (frequency adjustment) the vibrating states of the pair of vibrating arms 10 and 11 to vibrate within a predetermined frequency range is formed at the distal ends of the vibrating arms 10 and 11. By performing frequency adjustment using the weight metal film 21, the frequency of the pair of the vibrating arms 10 and 11 can be set to fall within the nominal frequency range of the device.

Base Portion

As shown in FIGS. 5 and 6, the base portion 12 is adjacent to the vibrating arms 10 and 11 and supports the base ends of the vibrating arms 10 and 11. A pair of recess portions 41 and 42 is formed on both side surfaces 43 and 44 in the width direction W of the base portion 12. In the present embodiment, the width of the base portion 12 in the positive X direction with respect to the recess portions 41 and 42 is larger than the width of the base portion 12 in the negative X direction with respect to the recess portions 41 and 42.

The recess portions 41 and 42 are formed between the main mount electrodes 16 and 17 and the auxiliary mount electrode 25 so that the recess portions 41 and 42 are disposed between the main bumps and the auxiliary bump in the longitudinal direction X when the piezoelectric vibrating reed 4 is mounted on the base substrate. The depths of the recess portions 41 and 42 are equal to the width W1 of each of the vibrating arms 10 and 11 in the base portion 12 in the positive X direction, and the bottom surfaces of the recess portions 41 and 42 are formed approximately in parallel along the central axis O. Moreover, the recess portions 41 and 42 penetrate the piezoelectric vibrating reed 4 in the thickness direction from the upper surface P to reach the lower surface Q. In this way, by forming the recess portions 41 and 42 while increasing the width of the base portion 12 in the positive X direction, it is possible to secure the strength of the base portion 12. In addition, since the vibration of the piezoelectric vibrating reed 4 is more rarely transmitted in the positive X direction than towards the recess portions 41 and 42, the vibration of the piezoelectric vibrating reed 4 is rarely transmitted to the main bumps B1 disposed closer to the positive X direction than the recess portions 41 and 42. Therefore, it is possible to suppress the vibration leakage of the piezoelectric vibrator.

Main Mount Electrode and Auxiliary Mount Electrode

The pair of main mount electrodes 16 and 17 and the pair of extraction electrodes 19 and 20 are formed on both the upper surface P and the lower surface Q of the base portion 12. The main mount electrodes 16 and 17 are electrically connected to the excitation electrodes 13 and 14 through the extraction electrodes 19 and 20, respectively. Therefore, a voltage is applied to the pair of excitation electrodes 13 and 14 through the pair of main mount electrodes 16 and 17 and the pair of extraction electrodes 19 and 20. In addition, in addition to the main mount electrodes 16 and 17 and the extraction electrodes 19 and 20, the auxiliary mount electrode 25 is formed on both the upper surface P and the lower surface Q of the base portion 12. Since the main mount electrodes 16 and 17 and the auxiliary mount electrode 25 are formed on both the upper surface P and the lower surface Q, it becomes unnecessary to distinguish the front and rear sides of the piezoelectric vibrating reed 4 at the time of mounting. Thus, it is possible to prevent assembling errors of the piezoelectric vibrating reed 4. In addition, although the auxiliary mount electrode 25 of the present embodiment is formed in an approximately rectangular shape in top view, a circular shape, for example, is also possible.

The main mount electrodes 16 and 17 and the auxiliary mount electrode 25 are formed by forming a chromium (Cr) film as a base layer and forming a gold (Au) film thereon as a finishing layer. By forming the main mount electrodes 16 and 17 and the auxiliary mount electrode 25 so as to have the same structure, it is possible to form the main mount electrodes 16 and 17 and the auxiliary mount electrode 25 at the same time. In addition, in a mounting step described later, the auxiliary mount electrode 25 can be bonded to the auxiliary bump under the same conditions as the bonding of the main mount electrodes 16 and 17 to the main bumps.

As shown in FIG. 6, the auxiliary mount electrode 25 is formed between the main mount electrodes 16 and 17 and the base ends of the vibrating arms 10 and 11 in the longitudinal direction X and between the main mount electrodes 16 and 17 in the width direction W.

As disclosed in the Journal of IEICE (The Institute of Electronics, Information and Communication Engineers), Volume J72-A, No. 11, Page 1736, November 1989, in the longitudinal direction X of the piezoelectric vibrating reed 4, the nodal point G of the vibration of the piezoelectric vibrating reed 4 is disposed at the position which is separated from the tip end of the base portion 12 toward the base end side by a distance corresponding to approximately ½ of the width W1 of the vibrating arms 10 and 11. Moreover, the nodal point G of the vibration of the piezoelectric vibrating reed 4 is disposed approximately at the center in the width direction W of the piezoelectric vibrating reed 4.

The auxiliary mount electrode 25 is disposed so as to include the nodal point G of the vibration described above. By doing so, since the auxiliary bump can be bonded to the base portion 12 in the area near the nodal point G of vibration where the magnitude of vibration is small, the vibration of the piezoelectric vibrating reed 4 will rarely leak to the outside through the auxiliary bump. Furthermore, in the present embodiment, the auxiliary mount electrode 25 is disposed so that the center of the auxiliary mount electrode 25 is identical to the nodal point G of the vibration described above. Since the nodal point G of the vibration does not vibrate, by bonding the auxiliary bump with the center of the auxiliary mount electrode 25 identical to the nodal point G of the vibration, the vibration of the piezoelectric vibrating reed 4 will yet more rarely leak to the outside. Therefore, it is possible to further suppress the vibration leakage of the piezoelectric vibrator while securing the mounting strength of the piezoelectric vibrating reed 4.

The auxiliary mount electrode 25 of the present embodiment is formed in a state of being electrically isolated from the main mount electrodes 16 and 17 and the extraction electrodes 19 and 20 which are formed in the base portion 12. Therefore, short-circuiting between the electrodes can be prevented. Since the auxiliary mount electrode 25 is not electrically connected to the outer electrodes of the piezoelectric vibrator described later, no power is supplied from the outer electrodes to the auxiliary mount electrode 25. Therefore, when the auxiliary mount electrode 25 is electrically connected to only one main mount electrode, there will be no short-circuit between the electrodes. Thus, the auxiliary mount electrode 25 can be formed to be connected to one extraction electrode which is adjacent to the auxiliary mount electrode 25. In this way, it is unnecessary to form electrodes with a small gap around the auxiliary mount electrode 25.

Piezoelectric Vibrator

As shown in FIGS. 1, 3, and 4, the lid substrate 3 is a substrate that can be anodically bonded and that is made of a glass material, for example, soda-lime glass, and is formed in a plate-like form. On a bonding surface side of the lid substrate 3 to be bonded to the base substrate 2, a recess portion 3a for a cavity is formed in which the piezoelectric vibrating reed 4 is accommodated. The recess portion 3a for a cavity serves as a cavity C that accommodates the piezoelectric vibrating reed 4 when the two substrates 2 and 3 are superimposed onto each other.

The base substrate 2 is a substrate that is made of a glass material, for example, soda-lime glass, and is formed in an approximately plate-like form having the same outer shape as the lid substrate 3 as shown in FIGS. 1 to 4. Moreover, the base substrate 2 is formed with a pair of penetration holes 30 and 31 penetrating through the base substrate 2 in the thickness direction thereof and a pair of penetration electrodes 32 and 33.

As shown in FIGS. 2 and 3, the penetration holes 30 and 31 are formed so as to be received in the cavity C when the piezoelectric vibrator 1 is formed. More specifically, the penetration holes 30 and 31 of the present embodiment are formed such that one penetration hole 30 is positioned at a corresponding position close to the base portion 12 of the mounted piezoelectric vibrating reed 4 which is mounted in a mounting step described later, and the other penetration hole 31 is positioned at a corresponding position close to the tip end sides of the vibrating arms 10 and 11.

As shown in FIG. 3, the penetration electrode 32 is formed by a cylindrical member 6 made of glass and a conductive member 7 which are disposed at the inner side of the penetration hole 30.

In the present embodiment, the cylindrical member 6 is obtained by baking a paste-like glass frit. The cylindrical member 6 has a shape of which both ends are flat and which has approximately the same thickness as the base substrate 2. The conductive member 7 is disposed at the center of the cylindrical member 6 so as to penetrate through the cylindrical member 6. The cylindrical member 6 is tightly attached to the conductive member 7 and the penetration hole 30.

The cylindrical member 6 and the conductive member 7 serve to maintain airtightness of the inside of the cavity C by completely closing the penetration hole 30 and also to make a lead-out electrode 36 and an outer electrode 38 described later electrically connected to each other. The penetration electrode 33 is formed similarly to the penetration electrode 32. Moreover, the same relationship between the penetration electrode 32, the lead-out electrode 36, and the outer electrode 39 applies to the relationship between the penetration electrode 33, the lead-out electrode 37, and the outer electrode 39.

Lead-Out Electrode, Auxiliary Electrode, and Outer Electrode

As shown in FIGS. 2 to 4, a pair of lead-out electrodes 36 and 37 is formed on the upper surface U side of the base substrate 2. In addition, an auxiliary electrode 34 which is separated from the lead-out electrodes 36 and 37 is formed on the upper surface U side of the base substrate 2. Moreover, the lead-out electrodes 36 and 37 and the auxiliary electrode 34 are formed of a material having high conductivity and high resistance to corrosion. In the present embodiment, the lead-out electrodes 36 and 37 and the auxiliary electrode 34 are formed by forming a Cr film as a base layer and forming an Au film thereon as a finishing layer. Since a Cr film having high adhesion to a glass-based substrate is used as the base layer, the lead-out electrodes 36 and 37 and the auxiliary electrode 34 can be firmly attached to the upper surface U of the base substrate wafer 40 which is made of a glass-based material. By forming the lead-out electrodes 36 and 37 and the auxiliary electrode 34 so as to have the same structure, it is possible to form the lead-out electrodes 36 and 37 and the auxiliary electrode 34 at the same time. In addition, when bumps are formed by wire bonding in an electrode pattern forming step described later, the auxiliary bump can be formed on the auxiliary electrode 34 with the same condition as the forming of the main bumps on the lead-out electrodes 36 and 37.

As shown in FIG. 4, one lead-out electrode 36 among the pair of lead-out electrodes 36 and 37 is formed so as to be disposed right above one penetration electrode 32. Moreover, the other lead-out electrode 37 is formed so as to be disposed right above the other penetration electrode 33 after being led out from a position near one lead-out electrode 36 towards the tip end sides of the vibrating arms 10 and 11 along the vibrating arms 10 and 11.

Moreover, the auxiliary electrode 34 is positioned in the negative X direction of the penetration electrodes 32 and 33 in the longitudinal direction X and between the penetration electrodes 32 and 33 in the width direction W and is formed at a position corresponding to the auxiliary mount electrode 25 of the piezoelectric vibrating reed 4. The auxiliary electrode 34 is not electrically connected to the penetration electrodes 32 and 33.

Moreover, as shown in FIGS. 1, 3, and 4, a pair of outer electrodes 38 and 39 is formed on the lower surface L of the base substrate 2. The pair of outer electrodes 38 and 39 is formed at both ends in the longitudinal direction of the base substrate 2 and is electrically connected to the pair of penetration electrodes 32 and 33, respectively.

Main Bump and Auxiliary Bump

A pair of main bumps B1 is formed on the pair of lead-out electrodes 36 and 37 described above. Moreover, an auxiliary bump B2 is formed on the auxiliary electrode 34. The main bumps B1 and the auxiliary bump B2 are formed in a tapered form by gold material.

In a mounting step described later, the pair of main mount electrodes 16 and 17 of the piezoelectric vibrating reed 4 is bonded to the pair of main bumps B1. When the pair of main mount electrodes 16 and 17 is bonded to the pair of main bumps B1, one main mount electrode 16 is electrically connected to one penetration electrode 32 through one lead-out electrode 36, and the other main mount electrode 17 is electrically connected to the other penetration electrode 33 through the other lead-out electrode 37.

The auxiliary mount electrode 25 is bonded to the auxiliary bump B2 at the same time as the bonding of the main mount electrodes 16 and 17 to the main bumps B1. The auxiliary mount electrode 25 of the base portion 12 is bonded to the auxiliary bump B2 in an area between the main bumps B1 in the width direction W of the base portion 12 and an area between the main bumps B1 and the base ends of the vibrating arms 10 and 11 in the longitudinal direction X of the base portion 12.

When the piezoelectric vibrator 1 configured in this manner is operated, a predetermined drive voltage is applied between the outer electrodes 38 and 39 formed on the base substrate 2. In this way, since a voltage can be applied to the excitation electrode 15 including the first and second excitation electrodes 13 and 14, of the piezoelectric vibrating reed 4 through the main bumps B1, the pair of vibrating arms 10 and 11 can be allowed to vibrate at a predetermined frequency in a direction of moving closer to or away from each other. This vibration of the pair of vibrating arms 10 and 11 can be used as the time source, the timing source of a control signal, the reference signal source, and the like.

In the present embodiment, the auxiliary bump B2 is bonded to the nodal point G of the vibration of the piezoelectric vibrating reed 4 described above. When the piezoelectric vibrating reed 4 vibrates, since the nodal point G of the vibration does not vibrate, the vibration of the piezoelectric vibrating reed 4 rarely leaks to the outside through the auxiliary bump B2. Therefore, it is possible to suppress the vibration leakage of the piezoelectric vibrator 1 while securing the mounting strength of the piezoelectric vibrating reed 4.

Piezoelectric Vibrator Manufacturing Method

Next, a method for manufacturing the above-described piezoelectric vibrator will be described with reference to a flowchart.

Figure 8:
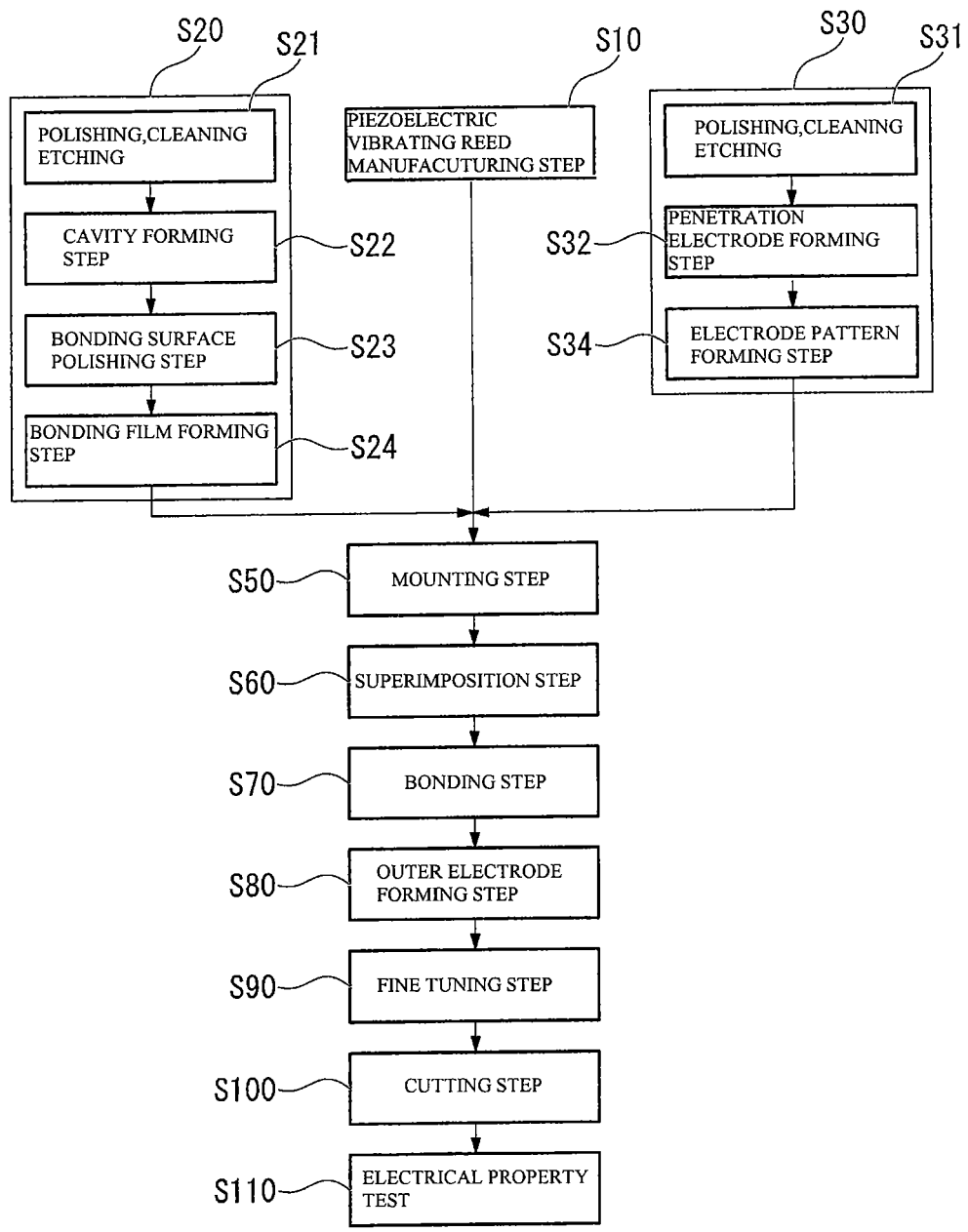
FIG. 8 is a flowchart of the manufacturing method of a piezoelectric vibrator.

FIG. 8 is a flowchart of the manufacturing method of a piezoelectric vibrator according to the present embodiment.

Figure 9:
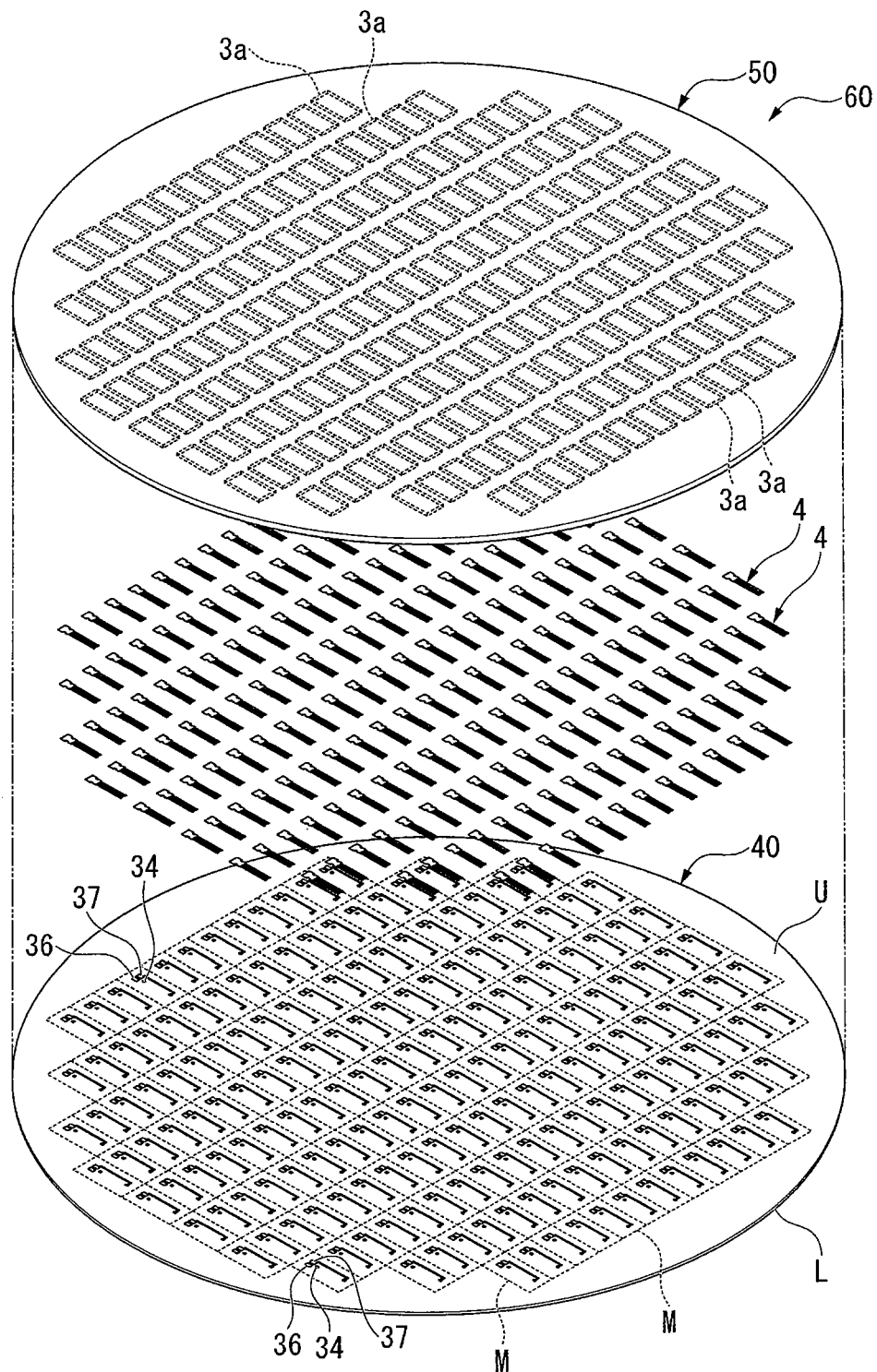
FIG. 9 is an exploded perspective view of a wafer assembly.

FIG. 9 is an exploded perspective view of a wafer assembly. The dotted line shown in FIG. 9 is a cutting line M along which a cutting step performed later is achieved.

The manufacturing method of the piezoelectric Vibrator according to the present embodiment mainly includes a piezoelectric vibrating reed manufacturing step (S10), a lid substrate wafer manufacturing step (S20), a base substrate wafer manufacturing step (S30), and an assembling step (S50 and subsequent steps). Among the steps, the piezoelectric vibrating reed manufacturing step (S10), the lid substrate wafer manufacturing step (S20), and the base substrate wafer manufacturing step (S30) can be performed in parallel.

Piezoelectric Vibrating Reed Manufacturing Step

In the piezoelectric vibrating reed manufacturing step S10, the piezoelectric vibrating reed 4 shown in FIGS. 5 to 7 is manufactured. Specifically, first, a rough quartz crystal Lambert is sliced at a predetermined angle to obtain a wafer having a constant thickness. Subsequently, the wafer is subjected to crude processing by lapping, and an affected layer is removed by etching. Then, the wafer is subjected to mirror polishing processing such as polishing to obtain a wafer having a predetermined thickness. Subsequently, the wafer is subjected to appropriate processing such as washing, and the wafer is patterned so as to have the outer shape of the piezoelectric vibrating reed 4 by a photolithography technique. Moreover, a metal film is formed and patterned on the wafer, thus forming the excitation electrode 15, the extraction electrodes 19 and 20, the main mount electrodes 16 and 17, the auxiliary mount electrode 25, and the weight metal film 21. In this way, a plurality of piezoelectric vibrating reeds 4 can be manufactured. Subsequently, rough tuning of the resonance frequency of the piezoelectric vibrating reed 4 is performed. This rough tuning is achieved by irradiating the rough tuning film 21a of the weight metal film 21 with a laser beam to evaporate in part the rough tuning film 21a, thus changing the weight of the vibrating arms 10 and 11.

Lid Substrate Wafer Manufacturing Step

In the lid substrate wafer manufacturing step S20, as shown in FIG. 9, the lid substrate wafer 50 later serving as the lid substrate is manufactured. First, a disk-shaped lid substrate wafer 50 made of a soda-lime glass is polished to a predetermined thickness and cleaned, and then, the affected uppermost layer is removed by etching or the like (S21). Subsequently, in a cavity forming step S22, a plurality of recess portions 3a for cavities is formed on a bonding surface of the lid substrate wafer 50 to be bonded to the base substrate wafer 40. The recess portions 3a for cavities are formed by heat-press molding, etching, or the like. After that, in a bonding surface polishing step S23, the bonding surface bonded to the base substrate wafer 40 is polished.

Subsequently, in a bonding film forming step S24, a bonding film 35 shown in FIGS. 1, 3, and 4 is formed on the bonding surface to be bonded to the base substrate wafer 40. The bonding film 35 may be formed on the entire inner surface of the cavity C in addition to the bonding surface to be bonded to the base substrate wafer 40. In this way, patterning of the bonding film 35 is not necessary, and the manufacturing cost can be reduced. The bonding film 35 can be formed by a film-formation method such as sputtering or CVD. Since the bonding surface polishing step S23 is performed before the bonding film forming step S24, the flatness of the surface of the bonding film 35 can be secured, and stable bonding with the base substrate wafer 40 can be achieved.

Base Substrate Wafer Manufacturing Step

In a base substrate wafer manufacturing step S30, as shown in FIG. 9, the base substrate wafer 40 later serving as the base substrate is manufactured. First, a disk-shaped base substrate wafer 40 made of a soda-lime glass is polished to a predetermined thickness and cleaned, and then, the affected uppermost layer is removed by etching or the like (S31).

Penetration Electrode Forming Step

Subsequently, a penetration electrode forming step S32 is performed where the pair of penetration electrodes 32 and 33 is formed on the base substrate wafer 40. In the following description, although only the step of forming the penetration electrode 32 is described, the same applies to the step of forming the penetration electrode 33.

First, penetration holes 30 are formed in the base substrate wafer 40 by performing press working or the like in a direction from the lower surface L towards the upper surface U. Subsequently, the conductive member 7 is inserted into the penetration holes 30 and a paste material made of glass frit is filled therein. After that, the paste material is baked so that the cylindrical member 6 made of glass, the penetration holes 30, and the conductive member 7 are integrated with each other. Finally, both the upper surface U and the lower surface L of the base substrate wafer 40 are polished to obtain a flat surface while exposing the conductive member 7 to both the upper surface U and the lower surface L, whereby the penetration electrodes 32 are formed in the penetration holes 30. With the penetration electrodes 32, electrical connection between the upper surface U side and the lower surface L side of the base substrate wafer 40 is secured, and airtightness of the inside of the cavity C can be secured.

Electrode Pattern Forming Step

Subsequently, as shown in FIGS. 4 and 9, an electrode pattern forming step S34 is performed where the lead-out electrodes 36 and 37 and the auxiliary electrode 34 are formed on the upper surface U of the base substrate wafer 40. In the present embodiment, since the lead-out electrodes 36 and 37 and the auxiliary electrode 34 are made of the same material, it is possible to form the lead-out electrodes 36 and 37 and the auxiliary electrode 34 at the same time. The lead-out electrodes 36 and 37 and the auxiliary electrode 34 are formed by patterning a coating formed by a sputtering method, a vacuum deposition method, or the like using a photolithography technique.

Moreover, as shown in FIGS. 2 to 4, a pair of main bumps B1 is formed on the pair of lead-out electrodes 36 and 37, and an auxiliary bump B2 is formed on the auxiliary electrode 34. Specifically, the bumps are formed as follows.

First, the tip end of an ultrafine gold wire is welded using a wire bonder, and a gold ball is formed on the tip end of the gold wire. Subsequently, the gold ball at the tip end of the gold wire is bonded to the bump formation positions of the lead-out electrodes 36 and 37 and the auxiliary electrode 34, and then, the gold wire is pulled and cut, whereby the main bumps B1 and the auxiliary bump B2 are formed. In FIG. 9, for better understanding of the drawing, illustrations of the main bumps and the auxiliary bump are omitted. The base substrate wafer manufacturing step S30 ends at this point in time.

Mounting Step

Subsequently, a mounting step S50 is performed where the piezoelectric vibrating reeds 4 are bonded to the lead-out electrodes 36 and 37 and the auxiliary electrode 34 of the base substrate wafer 40 by the main bumps B1 and the auxiliary bump B2. In the present embodiment, the piezoelectric vibrating reeds 4 are mounted on the base substrate wafer 40 by a flip-chip bonding method.

Specifically, first, the piezoelectric vibrating reeds 4 are picked up by performing vacuum suction or the like using a bonding head of a flip chip bonder (not shown), and the piezoelectric vibrating reeds 4 are moved onto the base substrate wafer 40. Subsequently, the main mount electrodes 16 and 17 are pressed against the main bumps B1 formed on the lead-out electrodes 36 and 37, and the auxiliary mount electrode 25 is pressed against the auxiliary bump B2 formed on the auxiliary electrode 34. After that, the bonding head is heated so that a bonding interface between the main mount electrodes 16 and 17 and the lead-out electrodes 36 and 37 and the bonding interface between the auxiliary mount electrode 25 and the auxiliary electrode 34 are heated to a predetermined temperature. Then, the bonding head is ultrasonically vibrated in the horizontal and vertical directions. In this way, the main mount electrodes 16 and 17 can be ultrasonically bonded to the main bumps B1, and the auxiliary mount electrode 25 can be ultrasonically bonded to the auxiliary bump B2. Moreover, as shown in FIG. 3, the base portion 12, the main bumps B1, and the auxiliary bump B2 are mechanically fixed in a state where the vibrating arms 10 and 11 of the piezoelectric vibrating reed 4 are floated from the upper surface U of the base substrate wafer 40.

Superimposition Step and Subsequent Steps

After the mounting of the piezoelectric vibrating reed 4 is completed, as shown in FIG. 9, a superimposition step S60 is performed where the lid substrate wafer 50 is superimposed onto the base substrate wafer 40. Specifically, the two wafers 40 and 50 are aligned at a correct position using reference marks or the like not shown in the figure as indices. In this way, the piezoelectric vibrating reed 4 mounted on the base substrate wafer 40 is accommodated in the cavity C which is surrounded by the recess portion 3a for cavities of the lid substrate wafer 50 and the base substrate wafer 40.

After the superimposition step S60 is performed, a bonding step S70 is performed where the two superimposed wafers 40 and 50 are inserted into an anodic bonding machine (not shown) to achieve anodic bonding under a predetermined temperature atmosphere with application of a predetermined voltage. Specifically, a predetermined voltage is applied between the bonding film 35 and the base substrate wafer 40. Then, an electrochemical reaction occurs at an interface between the bonding film 35 and the base substrate wafer 40, whereby they are closely and tightly adhered and anodically bonded. In this way, the piezoelectric vibrating reed 4 can be sealed in the cavity C, and a wafer assembly 60 in which the base substrate wafer 40 and the lid substrate wafer 50 are bonded to each other can be obtained as shown in FIG. 9. In FIG. 9, for better understanding of the drawing, the wafer assembly 60 is illustrated in an exploded state, and illustration of the bonding film 35 is omitted from the lid substrate wafer 50.

Subsequently, an outer electrode forming step S80 is performed where a conductive material is patterned onto the lower surface L of the base substrate wafer 40 so as to form a plurality of pairs of outer electrodes 38 and 39 (see FIG. 3) which is electrically connected to the pair of penetration electrodes 32 and 33. By this step, the piezoelectric vibrating reed 4 is electrically connected to the outer electrodes 38 and 39 through the main bumps B1, the lead-out electrodes 36 and 37, and the penetration electrodes 32 and 33.

Subsequently, a fine tuning step S90 is performed on the wafer assembly 60 where the frequencies of the individual piezoelectric vibrators sealed in the cavities C are tuned finely to fall within a predetermined range. Specifically, a predetermined voltage is continuously applied to the outer electrodes 38 and 39 shown in FIG. 4 to allow the piezoelectric vibrating reeds 4 to vibrate, and the vibration frequency is measured. In this state, a laser beam is irradiated onto the base substrate wafer 40 from the outer side so as to evaporate the fine tuning film 21b of the weight metal film 21 shown in FIGS. 5 and 6. In this way, since the weight on the tip end sides of the pair of vibrating arms 10 and 11 decreases, the frequency of the piezoelectric vibrating reed 4 increases. By so doing, the frequency of the piezoelectric vibrator can be finely tuned so as to fall within the range of the nominal frequency.

After the fine tuning of the frequency is completed, a cutting step S100 is performed where the bonded wafer assembly 60 is cut along the cutting line M shown in FIG. 9. Specifically, first, a UV tape is attached on the surface of the base substrate wafer 40 of the wafer assembly 60. Subsequently, a laser beam is irradiated along the cutting line M from the side of the lid substrate wafer 50 (scribing). Subsequently, the wafer assembly 60 is divided and cut along the cutting line M by a cutting blade pressing against the surface of the UV tape (breaking). After that, the UV tape is separated by irradiation of UV light. In this way, it is possible to divide the wafer assembly 60 into a plurality of piezoelectric vibrators. The wafer assembly 60 may be cut by other methods such as dicing.

Moreover, the fine adjustment step S90 may be performed after cutting the wafer assembly into pieces of individual piezoelectric vibrators in the cutting step S100. However, as described above, the fine adjustment can be performed on the form of the wafer assembly 60 by performing the fine adjustment step S90 first. Therefore, in the case of performing the fine adjustment step S90 first, a plurality of piezoelectric vibrators can be finely adjusted more efficiently. This is preferable since the throughput can be improved.

Then, an inner electrical property test S110 is performed. That is, resonance frequency, resonant resistance value, drive level characteristics (excitation power dependency of resonance frequency and resonant resistance value), and the like of the piezoelectric vibrating reed 4 are checked by measurement. Moreover, an insulation resistance characteristic and the like are checked together. Finally, visual inspection of the piezoelectric vibrator is performed to finally check the dimensions, quality, and the like. Thus, the manufacturing of the piezoelectric vibrator ends.

According to the present embodiment, as shown in FIGS. 2 to 4, since the base portion 12 of the piezoelectric vibrating reed 4 is bonded to the base substrate 2 by the plurality of main bumps B1 and the auxiliary bump B2, it is possible to improve the mounting strength of the piezoelectric vibrating reed 4. Moreover, the auxiliary bump B2 is bonded to the base portion 12 in an area between the main bumps B1 disposed at both ends in the width direction W of the base portion 12 and an area between the main bumps B1 and the base ends of the vibrating arms 10 and 11 in the longitudinal direction X of the base portion 12. These areas are near the nodal point G of vibration as disclosed in the Journal of IEICE (The Institute of Electronics, Information and Communication Engineers), Volume J72-A, No. 11, Page 1736, November 1989. Therefore, the magnitude of vibration of the piezoelectric vibrating reed 4 is small in these areas. Since the auxiliary bump B2 is bonded to the base portion 12 in the areas near the nodal point G of vibration where the magnitude of vibration is small, the vibration of the piezoelectric vibrating reed 4 will rarely leak to the outside through the auxiliary bump B2. In this way, it is possible to suppress the vibration leakage of the piezoelectric vibrator 1. Therefore, it is possible to suppress the vibration leakage of the piezoelectric vibrator 1 while securing the mounting strength of the piezoelectric vibrating reed 4.

Moreover, according to the present embodiment, the auxiliary bump B2 is disposed at the nodal point G of the vibration which is separated from the tip end of the base portion 12 of the piezoelectric vibrating reed 4 towards the base end side in the positive X direction by a distance corresponding to ½ of the width W1 of the vibrating arm. Since the nodal point G of the vibration does not vibrate, the vibration of the piezoelectric vibrating reed 4 will rarely leak to the outside through the auxiliary bump B2. Therefore, it is possible to further suppress the vibration leakage of the piezoelectric vibrator 1 while securing the mounting strength of the piezoelectric vibrating reed 4.

Furthermore, according to the present embodiment, since the recess portions 41 and 42 are formed on the side surfaces 43 and 44 in the width direction W of the base portion 12, the vibration of the vibrating arms 10 and 11 is more rarely transmitted to the base end side than the recess portions 41 and 42. Moreover, since the recess portions 41 and 42 are disposed between the main bumps B1 and the auxiliary bump B2 in the longitudinal direction X, the vibration of the piezoelectric vibrating reed 4 will rarely be transmitted to the main bumps B1. As a result, the vibration of the piezoelectric vibrating reed 4 will rarely leak to the outside through the main bumps B1. Therefore, it is possible to further suppress the vibration leakage of the piezoelectric vibrator 1 while securing the mounting strength of the piezoelectric vibrating reed 4.

Oscillator

Next, an oscillator according to another embodiment of the invention will be described with reference to FIG. 10.

Figure 10:
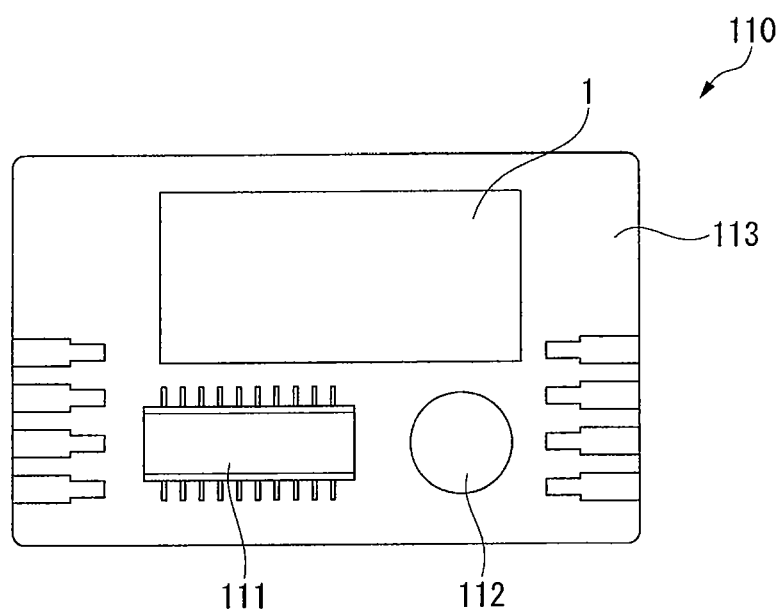
FIG. 10 is a view showing the schematic configuration of an oscillator according to an embodiment of the present invention.

In an oscillator 110 according to the present embodiment, the piezoelectric vibrator 1 is used as an oscillating piece electrically connected to an integrated circuit 111, as shown in FIG. 10. The oscillator 110 includes a substrate 113 on which an electronic component 112, such as a capacitor, is mounted. The integrated circuit 111 for an oscillator is mounted on the substrate 113, and the piezoelectric vibrating reed of the piezoelectric vibrator 1 is mounted near the integrated circuit 111. The electronic component 112, the integrated circuit 111, and the piezoelectric vibrator 1 are electrically connected to each other by a wiring pattern (not shown). In addition, each of the constituent components is molded with a resin (not shown).

In the oscillator 110 configured as described above, when a voltage is applied to the piezoelectric vibrator 1, the piezoelectric vibrating reed in the piezoelectric vibrator 1 vibrates. This vibration is converted into an electrical signal due to the piezoelectric property of the piezoelectric vibrating reed and is then input to the integrated circuit 111 as the electrical signal. The input electrical signal is subjected to various kinds of processing by the integrated circuit 111 and is then output as a frequency signal. In this way, the piezoelectric vibrator 1 functions as an oscillator piece.

Moreover, by selectively setting the configuration of the integrated circuit 111, for example, an RTC (real time clock) module, according to the demands, it is possible to add a function of controlling the operation date or time of the corresponding device or an external device or of providing the time or calendar in addition to a single functional oscillator for a clock.

As described above, since the oscillator 110 according to the present embodiment includes the piezoelectric vibrator 1 capable of suppressing vibration leakage while securing mounting strength of the piezoelectric vibrating reed, the oscillator 110 having superior reliability and excellent performance can be provided.

Electronic Apparatus

Figure 11:
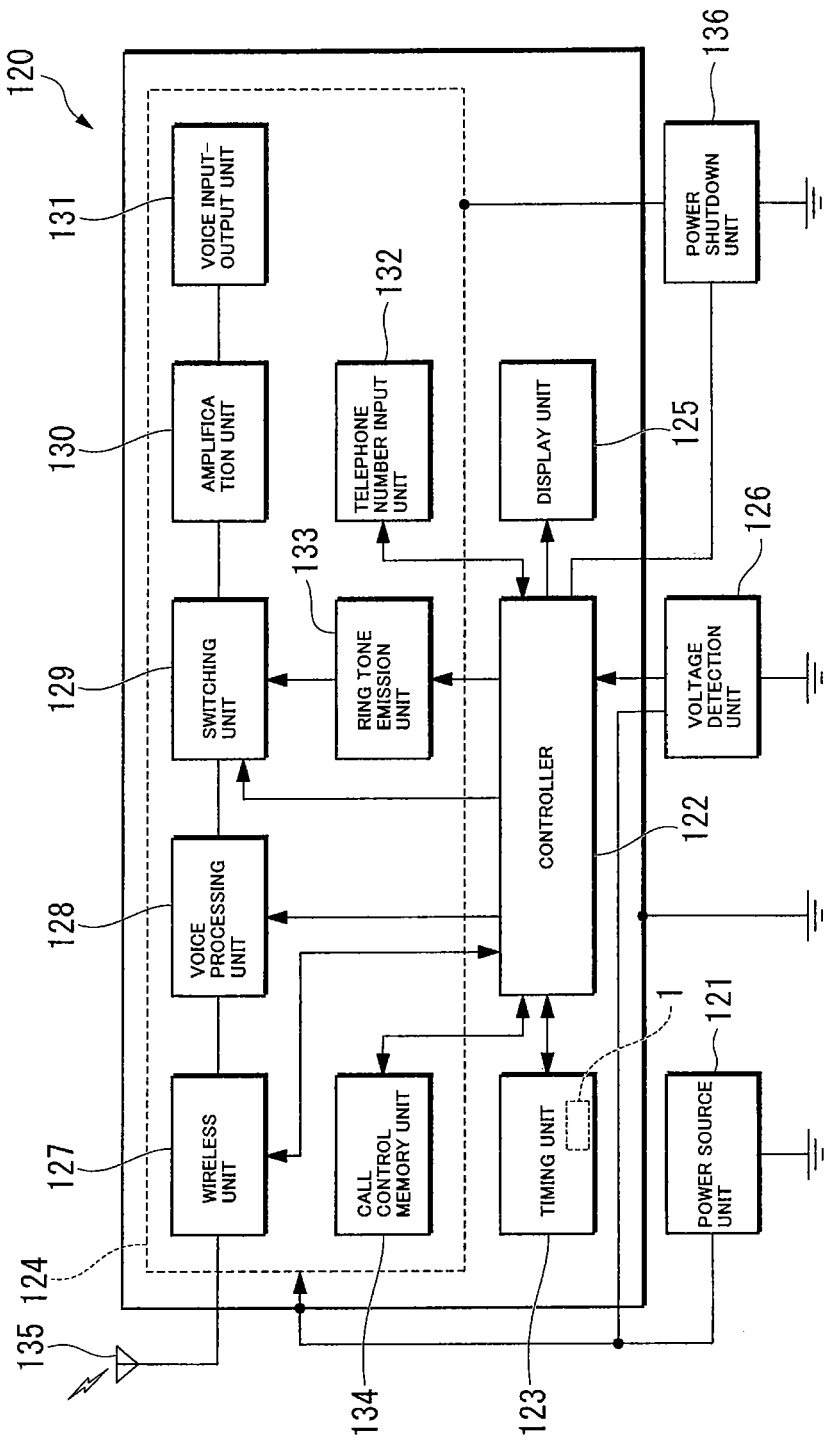
FIG. 11 is a block diagram of an electronic apparatus according to an embodiment of the present invention.

Next, an electronic apparatus according to another embodiment of the invention will be described with reference to FIG. 11. In addition, a portable information device 120 including the piezoelectric vibrator 1 will be described as an example of an electronic apparatus.

The portable information device 120 according to the present embodiment is represented by a mobile phone, for example, and has been developed and improved from a wristwatch in the related art. The portable information device 120 is similar to a wristwatch in external appearance, and a liquid crystal display is disposed in a portion equivalent to a dial pad so that a current time and the like can be displayed on this screen. Moreover, when it is used as a communication apparatus, it is possible to remove it from the wrist and to perform the same communication as a mobile phone in the related art with a speaker and a microphone built in an inner portion of the band. However, the portable information device 120 is very small and light compared with a mobile phone in the related art.

Next, the configuration of the portable information device 120 according to the present embodiment will be described. As shown in FIG. 11, the portable information device 120 includes the piezoelectric vibrator 1 and a power supply section 121 for supplying power. The power supply section 121 is formed of a lithium secondary battery, for example. A control section 122 which performs various kinds of control, a clock section 123 which performs counting of time and the like, a communication section 124 which performs communication with the outside, a display section 125 which displays various kinds of information, and a voltage detecting section 126 which detects the voltage of each functional section are connected in parallel to the power supply section 121. In addition, the power supply section 121 supplies power to each functional section.

The control section 122 controls an operation of the entire system. For example, the control section 122 controls each functional section to transmit and receive the audio data or to measure or display a current time. In addition, the control section 122 includes a ROM in which a program is written in advance, a CPU which reads and executes a program written in the ROM, a RAM used as a work area of the CPU, and the like.

The clock section 123 includes an integrated circuit, which has an oscillation circuit, a register circuit, a counter circuit, and an interface circuit therein, and the piezoelectric vibrator 1. When a voltage is applied to the piezoelectric vibrator 1, the piezoelectric vibrating reed vibrates, and this vibration is converted into an electrical signal due to the piezoelectric property of crystal and is then input to the oscillation circuit as the electrical signal. The output of the oscillation circuit is binarized to be counted by the register circuit and the counter circuit. Then, a signal is transmitted to or received from the control section 122 through the interface circuit, and current time, current date, calendar information, and the like are displayed on the display section 125.

The communication section 124 has the same function as a mobile phone in the related art, and includes a wireless section 127, an audio processing section 128, a switching section 129, an amplifier section 130, an audio input/output section 131, a telephone number input section 132, a ring tone generating section 133, and a call control memory section 134.

The wireless section 127 transmits/receives various kinds of data, such as audio data, to/from the base station through an antenna 135. The audio processing section 128 encodes and decodes an audio signal input from the wireless section 127 or the amplifier section 130. The amplifier section 130 amplifies a signal input from the audio processing section 128 or the audio input/output section 131 up to a predetermined level. The audio input/output section 131 is formed by a speaker, a microphone, and the like, and amplifies a ring tone or incoming sound to a louder volume or collects the sound.

In addition, the ring tone generating section 133 generates a ring tone in response to a call from the base station. The switching section 129 switches the amplifier section 130, which is connected to the audio processing section 128, to the ring tone generating section 133 only when a call arrives, so that the ring tone generated in the ring tone generating section 133 is output to the audio input/output section 131 through the amplifier section 130.

In addition, the call control memory section 134 stores a program related to incoming and outgoing call control for communications. Moreover, the telephone number input section 132 includes, for example, numeric keys from 0 to 9 and other keys. The user inputs a telephone number of a communication destination by pressing these numeric keys and the like.

The voltage detecting section 126 detects a voltage drop when a voltage, which is applied from the power supply section 121 to each functional section, such as the control section 122, drops below the predetermined value, and notifies the control section 122 of the detection. In this case, the predetermined voltage value is a value which is set beforehand as a lowest voltage necessary to operate the communication section 124 stably. For example, it is about 3 V. When the voltage drop is notified from the voltage detecting section 126, the control section 122 disables the operation of the wireless section 127, the audio processing section 128, the switching section 129, and the ring tone generating section 133. In particular, the operation of the wireless section 127 that consumes a large amount of power should be necessarily stopped. In addition, a message informing that the communication section 124 is not available due to insufficient battery power is displayed on the display section 125.

That is, it is possible to disable the operation of the communication section 124 and display the notice on the display section 125 by the voltage detecting section 126 and the control section 122. This message may be a character message. Or as a more intuitive indication, a cross mark (X) may be displayed on a telephone icon displayed at the top of the display screen of the display section 125.

In addition, the function of the communication section 124 can be more reliably stopped by providing a power shutdown section 136 capable of selectively shutting down the power of a section related to the function of the communication section 124.

As described above, since the portable information device 120 according to the present embodiment includes the piezoelectric vibrator 1 capable of suppressing vibration leakage while securing a mounting strength of the piezoelectric vibrating reed, the portable information device 120 having superior reliability and excellent performance can be provided.

Radio-Controlled Timepiece

Next, a radio-controlled timepiece according to still another embodiment of the invention will be described with reference to FIG. 12.

Figure 12:
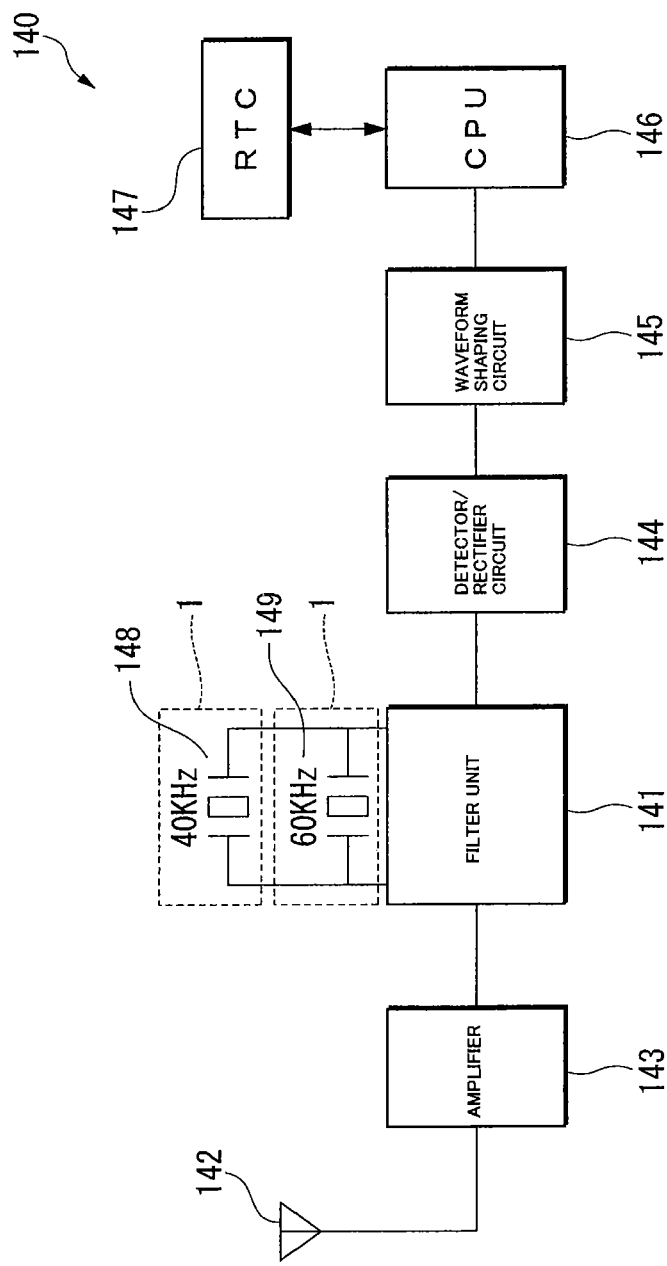
FIG. 12 is a block diagram of a radio-controlled timepiece according to an embodiment of the present invention.

As shown in FIG. 12, a radio-controlled timepiece 140 according to the present embodiment includes the piezoelectric vibrators 1 electrically connected to a filter section 141. The radio-controlled timepiece 140 is a clock with a function of receiving a standard radio wave including the clock information, automatically changing it to the correct time, and displaying the correct time.

In Japan, there are transmission centers (transmission stations) that transmit a standard radio wave in Fukushima Prefecture (40 kHz) and Saga Prefecture (60 kHz), and each center transmits the standard radio wave. A long wave with a frequency of, for example, 40 kHz or 60 kHz has both a characteristic of propagating along the land surface and a characteristic of propagating while being reflected between the ionospheric layer and the land surface, and therefore has a propagation range wide enough to cover the entire area in Japan through the two transmission centers.

Hereinafter, the functional configuration of the radio-controlled timepiece 140 will be described in detail.

An antenna 142 receives a long standard radio wave with a frequency of 40 kHz or 60 kHz. The long standard radio wave is obtained by performing AM modulation of the time information, which is called a time code, using a carrier wave with a frequency of 40 kHz or 60 kHz. The received long standard wave is amplified by an amplifier 143 and is then filtered and synchronized by the filter section 141 having the plurality of piezoelectric vibrators 1.

In the present embodiment, the piezoelectric vibrators 1 include crystal vibrator sections 148 and 149 having resonance frequencies of 40 kHz and 60 kHz, respectively, which are the same frequencies as the carrier frequency.

In addition, the filtered signal with a predetermined frequency is detected and demodulated by a detection and rectification circuit 144.

Then, the time code is extracted by a waveform shaping circuit 145 and counted by the CPU 146. The CPU 146 reads the information including the current year, the total number of days, the day of the week, the time, and the like. The read information is reflected on an RTC 147, and the correct time information is displayed.

Because the carrier wave is 40 kHz or 60 kHz, a vibrator having the tuning fork structure described above is suitable for the crystal vibrator sections 148 and 149.

Moreover, although the above explanation has been given for the case in Japan, the frequency of a long standard wave is different in other countries. For example, a standard wave of 77.5 kHz is used in Germany. Therefore, when the radio-controlled timepiece 140 which is also operable in other countries is assembled in a portable device, the piezoelectric vibrator 1 corresponding to frequencies different from the frequencies used in Japan is necessary.

As described above, since the radio-controlled timepiece 140 according to the present embodiment includes the piezoelectric vibrator 1 capable of suppressing vibration leakage while securing mounting strength of the piezoelectric vibrating reed, the radio-controlled timepiece 140 having superior reliability and excellent performance can be provided.

The present invention is not limited to the above-described embodiments.

Figure 13:
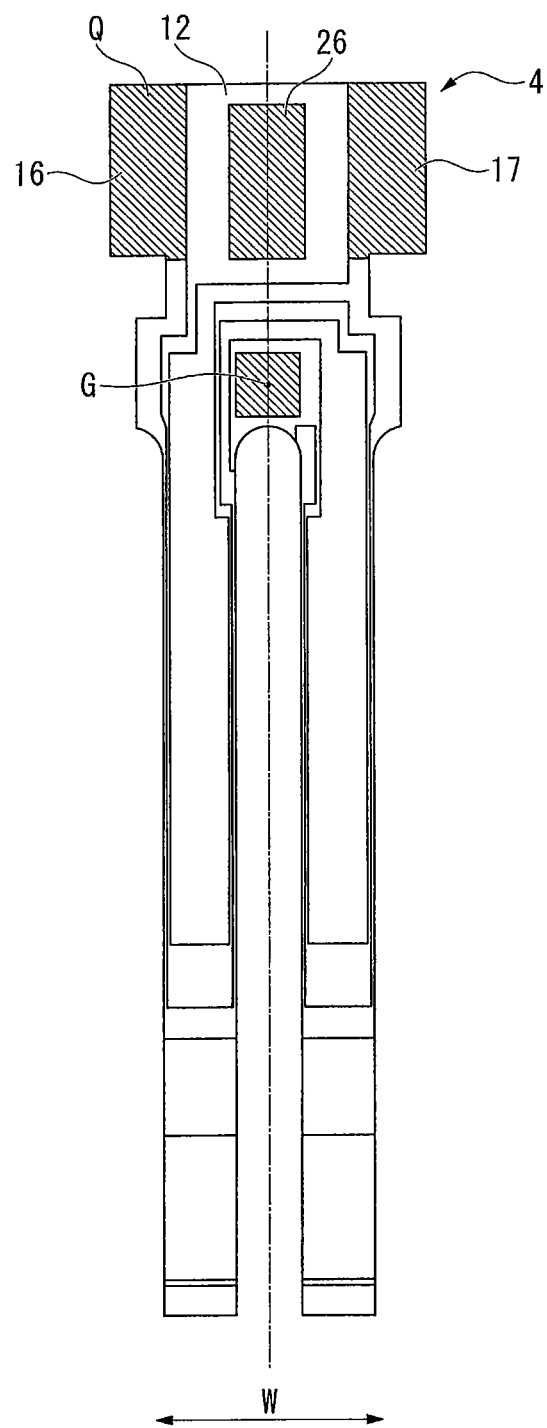
FIG. 13 is a bottom view of a piezoelectric vibrating reed in which three main mount electrodes are formed on a base portion.

FIG. 13 is a bottom view of a piezoelectric vibrating reed in which three main mount electrodes are formed on a base portion.

In the present embodiment, a pair of main mount electrodes is provided in the width direction of the base portion, and the pair of main mount electrodes is bonded to a pair of main bumps, whereby the piezoelectric vibrating reed is mounted on the substrate. However, as shown in FIG. 13, in addition to the pair of main mount electrodes 16 and 17 of the present embodiment, another main mount electrode 26 may be provided so that three main mount electrodes 16, 17, and 26 in total are formed in the width direction W of the base portion. By doing so, since the piezoelectric vibrating reed can be mounted on the substrate by bonding three main mount electrodes to three main bumps, the piezoelectric vibrating reed can be firmly mounted. However, since the number of main bumps increases as compared to the present embodiment, there is a possibility that the vibration of the piezoelectric vibrating reed can be easily transmitted to the outside. Therefore, the present embodiment is superior in terms of suppression of the vibration leakage.

In the present embodiment, only one auxiliary electrode and only one auxiliary bump are provided on the base substrate. However, two auxiliary electrodes and two auxiliary bumps may be provided at the corresponding positions near the center in the width direction of the base portion. By doing so, the mounting strength can be further improved compared with the present embodiment. However, since the number of auxiliary bumps increases as compared to the present embodiment, and the piezoelectric vibrating reed is mounted at a position separated from the nodal point of vibration, there is a possibility that the vibration of the piezoelectric vibrating reed can be easily transmitted to the outside. Therefore, the present embodiment is superior in terms of suppression of the vibration leakage.

In the present embodiment, the main mount electrodes and the auxiliary mount electrode are formed on both the upper and lower surfaces of the base portion of the piezoelectric vibrating reed. However, the main mount electrodes and the auxiliary mount electrode may be formed only on the lower surface of the base portion serving as the mounting surface of the piezoelectric vibrating reed. However, in this case, since it is necessary to distinguish the upper and lower surfaces of the piezoelectric vibrating reed, the present embodiment is superior in terms of prevention of the assembling errors in the mounting step.

In the present embodiment, the recess portions are formed so as to penetrate through the piezoelectric vibrating reed in the thickness direction from the upper surface to reach the lower surface. However, openings of the recess portions may be provided only on the side surfaces in the width direction of the base portion of the piezoelectric vibrating reed so that the recess portions do not penetrate through the piezoelectric vibrating reed in the thickness direction from the upper surface to reach the lower surface. However, the present embodiment is superior from the fact that vibration is made less easily be transmitted to the base end side than the recess portions.

In the present embodiment, the base portion is divided into a part close to the base end side with respect to the recess portions and a part close to the tip end side, and the width of the base portion on the base end side is larger than the width of the base portion on the tip end side. However, the width of the base portion on the base end side may be the same as the width of the base portion on the tip end side. However, the present embodiment is superior from the fact that the base portion on the base end side is formed to have a larger width so as to secure the strength of the base portion.

What is claimed is:

1. A method for producing piezoelectric vibrators, comprising:
   (a) defining a plurality of first substrates on a first wafer and a plurality of second substrates on a second wafer;
   (b) forming three electrode patterns electrically isolated from one another on a respective at least some of the first substrates;
   (c) forming a bump in electrical contact with each of the three electrode patterns on a respective at least some of the first substrates on which the three electrode patterns are formed;
   (d) forming a plurality of piezoelectric vibrating reeds each having a tuning fork shape consisting of a base and a pair of arms connected to the base, three mount electrodes being formed on the base so as to be electrically isolated from one another, wherein the three mount electrodes comprise a pair of mount electrodes for receiving electricity to vibrate the arms and an auxiliary mount electrode;
   (e) mounting the piezoelectric vibrating reed on a respective at least some of the first substrates on which the three bumps are formed, in such a manner that the three mount electrodes are bonded, respectively, with the three bumps formed on the three electrode patterns;
   (f) layering the first and second wafers such that at least some of the first substrates substantially coincide respectively with at least some of the corresponding second substrates, wherein the piezoelectric vibrating reed is secured in a cavity formed between a respective at least some of the coinciding first and second substrate pairs;
   (g) hermetically bonding at least some of the coinciding first and second substrate pairs;
   (h) cutting off from the first and second wafers a respective at least some of the hermetically bonded first and second substrate pairs.

2. The method according to claim 1, wherein forming a plurality of vibrating reeds comprises forming a plurality of vibrating reeds each having a base and arms connected to the base, wherein the base is formed with a pair of notches that reduce propagation of oscillation of the arms from the arms to the pair of mount electrodes.

3. The method according to claim 2, wherein forming a plurality of vibrating reeds comprises forming the three mount electrodes on a respective at least some of the vibrating reeds, and forming the three mount electrodes comprises forming the pair of mount electrodes between a proximal end of the base and the notches and forming the auxiliary mount electrode between a distal end of the base and the notches.

4. The method according to claim 3, wherein forming the auxiliary mount electrode comprises forming the auxiliary mount electrode so as to include a nodal point therein, wherein the nodal point is located in the base at a distance from the distal end of the base equal to about a half of a width of the arms.

5. The method according to claim 4, wherein forming the auxiliary mount electrode comprises forming the auxiliary mount electrode so as to include a nodal point at a center of the auxiliary mount electrode.

6. The method according to claim 3, wherein forming the three mount electrodes comprises forming a bonding film at least in part on a respective three mount electrodes, wherein the bonding film is made of a same metal as the bump.

7. The method according to claim 1, wherein forming three electrode patterns comprises forming a second bonding film at least in part on a respective three electrode patterns.

8. The method according to claim 7, wherein the bump is made of gold.

9. The method according to claim 1, wherein mounting the piezoelectric vibrating reed comprises ultrasonically bonding the three mount electrodes respectively with the three bumps on the three electrode patterns.

10. A piezoelectric vibrating reed comprising:
    a tuning fork type vibrating reed consisting of a base and a pair of vibrating arms connected to the base; and
    three mount electrodes formed on the base so as to be electrically isolated from one another, wherein the three mount electrodes comprise a pair of mount electrodes for receiving electricity to vibrate the arms and an auxiliary mount electrode for use in supporting the piezoelectric vibrating reed.

11. The piezoelectric vibrating reed according to claim 10, wherein the base is formed with a pair of notches that reduce propagation of oscillation of the arms from the arms to the pair of mount electrodes.

12. The piezoelectric vibrating reed according to claim 11, wherein the pair of mount electrodes are formed between a proximal end of the base and the notches, and the auxiliary mount electrode is formed between a distal end of the base and the notches.

13. The piezoelectric vibrating reed according to claim 10, wherein the auxiliary mount electrode is formed so as to include a nodal point therein, wherein the nodal point is located in the base at a distance from the distal end of the base equal to about a half of a width of the arms.

14. The piezoelectric vibrating reed according to claim 13, wherein the auxiliary mount electrode is formed so as to include a nodal point at a center of the auxiliary mount electrode.

15. The piezoelectric vibrating reed according to claim 10, wherein the three mount electrodes each comprise a bonding film formed at least in part thereon, wherein the bonding film is made of gold.

16. A piezoelectric vibrator comprising:
    a hermetically closed casing comprising first and second substrates with a cavity inside, wherein the first substrate is formed with three electrode patterns electrically isolated from one another on each of which a bump is formed in electrical contact with the electrode pattern; and
    the piezoelectric vibrating reed of claim 10 secured inside the cavity and electrically connected via the mount electrodes to the electrode patterns in such a manner that the bonding films and the bumps are fused together.

17. The piezoelectric vibrator according to claim 16, wherein the electrode patterns are each formed with a second bonding film, and bumps and the second bonding films are fused together.

18. An oscillator comprising the piezoelectric vibrator defined in claim 16.

19. An electronic device comprising the piezoelectric vibrator defined in claim 16.

20. The electronic device according to claim 19, wherein the electronic device is a radio-controlled timepiece.

* * * * *